United States Patent
Yamazaki et al.

(10) Patent No.: US 6,617,678 B2
(45) Date of Patent: Sep. 9, 2003

(54) SEMICONDUCTOR DEVICE

(75) Inventors: Takashi Yamazaki, Yokohama (JP); Mitsuyoshi Endo, Yamato (JP); Chiaki Takubo, Tokyo (JP); Katsuhiko Oyama, Tokyo (JP); Takashi Imoto, Yokohama (JP); Mikio Matsui, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/145,722

(22) Filed: May 16, 2002

(65) Prior Publication Data

US 2002/0195698 A1 Dec. 26, 2002

(30) Foreign Application Priority Data

Jun. 25, 2001 (JP) ......................... 2001-191979

(51) Int. Cl.$^7$ ........................... H01L 23/02; H01L 29/40
(52) U.S. Cl. ................. 257/686; 257/777; 257/685; 257/723
(58) Field of Search .................. 257/686, 685, 257/777, 723

(56) References Cited

U.S. PATENT DOCUMENTS

| | | | | |
|---|---|---|---|---|
| 5,138,438 A | * | 8/1992 | Masayuki et al. | 257/686 |
| 5,239,447 A | * | 8/1993 | Cotues et al. | 361/744 |
| 5,998,864 A | * | 12/1999 | Khandros et al. | 257/723 |
| 6,376,914 B2 | * | 4/2002 | Kovats et al. | 257/777 |
| 6,433,421 B2 | * | 8/2002 | Masuda et al. | 257/723 |
| 6,489,670 B1 | * | 12/2002 | Peterson et al. | 257/686 |
| 6,492,726 B1 | * | 12/2002 | Quek et al. | 257/723 |
| 6,514,794 B2 | * | 2/2003 | Haba et el. | 438/109 |
| 6,531,338 B2 | * | 3/2003 | Akram et al. | 438/108 |
| 2002/0149097 A1 | * | 10/2002 | Lee et al. | 257/686 |
| 2002/0180022 A1 | * | 12/2002 | Emoto | 257/686 |

FOREIGN PATENT DOCUMENTS

JP        2001-068624        3/2001

OTHER PUBLICATIONS

Takashi Imoto, Semiconductor Device and Manufacturing Method Thereof, U.S. patent application No. 09/648,373, filed Aug. 25, 2000, Now U.S. patent No. 6,469,374 B.

* cited by examiner

Primary Examiner—Jasmine J B Clark
(74) Attorney, Agent, or Firm—Finnegan, Henderson, Farabow, Garrett & Dunner, L.L.P.

(57) ABSTRACT

There is disclosed a semiconductor device which comprises a first chip-mounting substrate on which at least one semiconductor chip having a plurality of terminals is mounted, and a plurality of relay terminals electrically connected to the respective terminals of the semiconductor chip are disposed to surround a portion with the semiconductor chip mounted thereon from the outside in the vicinity of the portion, a second chip-mounting substrate which is laminated on the first chip-mounting substrate and on which at least one semiconductor chip is mounted, a plurality of relay terminals electrically connected to the respective terminals of the semiconductor chip are disposed to surround a portion with the semiconductor chip mounted thereon from the outside in the vicinity of the portion, and at least one of the semiconductor chips has a center offset from a center of a whole arrangement of the relay terminals.

30 Claims, 7 Drawing Sheets

2PRIOR ART

SEMICONDUCTOR DEVICE

CROSS-REFERENCE TO RELATED APPLICATIONS

This application is based upon and claims the benefit of priority from the prior Japanese Patent Application No. 2001-191979, filed Jun. 25, 2001, the entire contents of which are incorporated herein by reference.

BACKGROUND OF THE INVENTION

1. Field of the Invention

The present invention relates to a mounting technique of a semiconductor chip, particularly to a laminated structure of semiconductor chips on chip-mounting substrates in a laminated module in which a plurality of semiconductor chips are laminated, and a peripheral structure of the chips and the chip-mounting substrates.

2. Description of the Related Art

A semiconductor device constituted by laminating a plurality of semiconductor chips (semiconductor elements) is called a laminated semiconductor module, or a laminated semiconductor device. For example, a semiconductor chip constituted by laminating a plurality of memory chips is called a memory laminate. In general, when a number of semiconductor chip of one type are laminated as a memory laminate, external connection terminals for connecting each layers of semiconductor chip to other semiconductor chips are disposed at substantially the same positions on each layer. Therefore, since electric connection among the respective layers of the semiconductor chips can be constituted as substantially the same wiring constitutions among the layers, only small problems are generated in arranging the wiring.

In recent years, there has been an increasing demand for a compact-size semiconductor device. Therefore, as shown in FIG. 7, during manufacturing of a laminated semiconductor device 101, it has been necessary to mount (package) a chip 103 on a substrate 102 so that the center C of the semiconductor chip 103 agrees with the center X of the chip-mounting substrate (packaged substrate) 102. Additionally, it has been necessary to dispose and laminate the plurality of substrates 102 with the chips 103 mounted thereon so that the center C of the chip 103 and the center X of the substrate 102 substantially agree with a center Z of the whole device package 101.

Moreover, in recent years, semiconductor chips have been designed so that as many terminals as possible, such as electrodes, are disposed. For example, the chip 103 is formed with a substantially quadrangular shape in plan view, and a plurality of terminals 104 are densely arranged in each edge of one main surface of the chip. Furthermore, in a portion on which the chip 103 of the substrate 102 is mounted, pads 107 directly and electrically connected to the terminals 104 are disposed in a substantially quadrangular frame shape so that the pads have a one-to-one correspondence with the terminals 104. Additionally, in the substrate 102, a plurality of via terminals 105 individually and electrically connected to the terminals 104 via the pads 107 are densely arranged in a substantially quadrangular frame shape so as to surround the arrangement of the pads 107 from the outside in the vicinity of the pads. Each pad 107 is electrically connected beforehand to the via terminal 105 via a wiring 106 in one-to-one connection. Each wiring 106 is wired based on a predetermined wiring rule (design rule).

The chip 103 is mounted on the substrate 102 so that the terminal 104 is electrically connected to the pad 107, for example, by a flip chip method. Thereby, each terminal 104 is electrically connected to the via terminal 105 disposed opposite each edge of the chip 103 via the pad 107 and wiring 106. In this state, respective edges of the chip 103 are substantially parallel to portions corresponding to four frame edges formed of the arrangement of the via terminals 105.

Another laminated semiconductor device is a composite laminated semiconductor module (block module) 101 constituted by disposing the chips 103 whose types differ with the respective layers. In general, the outer shape, number of terminals 104, and mounted position of the chip 103 differ with the type of chip. Accordingly, the outer shape, number and mounted positions of pads 107 of the substrate 102 differ with the type of chip 103. When the respective chips 103 are electrically connected to one another among the layers of the composite laminated semiconductor module 101, an interlayer connecting wiring (not shown) other than the wiring 106 needs to be disposed in the module 101.

Additionally, the respective via terminals 105 are densely arranged so as to surround the portion on which the chip 103 with the pad 107 disposed therein is mounted from the outside in the vicinity of the portion. Moreover, most of the via terminals 105 are wired to the pads 107 arranged substantially opposite to the arrangement of the via terminals 105 so that the length of the wiring 106 becomes as short as possible. Therefore, it is remarkably difficult to simply wire the chips 103 of different layers to one another with a minimum distance. Furthermore, when the chips 103 of different layers are wired to one another, the wiring pattern on each substrate 102 includes a mixture of the wirings 106 arranged at coarse intervals, as shown by the two-dot chain line portion L in FIG. 7, and the wirings 106 arranged at dense intervals, as shown by the dotted portions H in FIG. 7. There is a possibility that such a wiring state (wiring pattern) conflicts with the wiring rule.

Therefore, in order to arrange the wirings among the layers in the module 101 without conflicting with the wiring rule, it is usually necessary to enlarge the size of the substrate 102 and broaden the interval between the via terminals 105. Then, the package size of the whole module 101 which was originally intended to be compact, disadvantageously increases.

BRIEF SUMMARY OF THE INVENTION

According to one aspect of the present invention, there is provided a laminated-chip semiconductor device comprising: a first chip-mounting substrate on which at least one semiconductor chip having a plurality of terminals is mounted, and a plurality of relay terminals electrically connected to the respective terminals of the semiconductor chip are disposed to surround a portion with the semiconductor chip mounted thereon from the outside in the vicinity of the portion; and a second chip-mounting substrate which is laminated on the first chip-mounting substrate and on which at least one semiconductor chip is mounted, a plurality of relay terminals electrically connected to the respective terminals of the semiconductor chip are disposed to surround a portion with the semiconductor chip mounted thereon from the outside in the vicinity of the portion, and at least one of the semiconductor chips has a center offset from a center of a whole arrangement of the relay terminals.

Moreover, according to one aspect of the present invention, there is provided a laminated-chip semiconductor device comprising: a plurality of semiconductor chips having a plurality of terminals; and a plurality of chip-mounting substrates on each of which at least one of the semiconductor chips is mounted, a plurality of relay terminals electrically connected to the respective terminals of the semiconductor chip are disposed to surround a portion with the semiconductor chip mounted thereon from the outside in the vicinity of the portion, and at least one of the semiconductor chips has a center offset from a center of a whole arrangement of the relay terminals in at least one of two or more laminated layers.

Furthermore, according to one aspect of the present invention, there is provided a laminated-chip semiconductor device comprising: a plurality of semiconductor chips having a plurality of terminals; and a plurality of chip-mounting substrates on each of which at least one of the semiconductor chips is mounted, a plurality of relay terminals electrically connected to the respective terminals of the semiconductor chip are disposed to surround a portion with the semiconductor chip mounted thereon from the outside in the vicinity of the portion, and at least one of the semiconductor chips has a center offset from a center of another semiconductor chip in at least two predetermined layers among two or more laminated layers.

Additionally, according to one aspect of the present invention, there is provided a laminated-chip semiconductor device comprising: a first chip-mounting substrate on which at least one semiconductor chip having a plurality of terminals is mounted, and a plurality of relay terminals electrically connected to the respective terminals of the semiconductor chip are disposed to surround a portion with the semiconductor chip mounted thereon from the outside in the vicinity of the portion; and a second chip-mounting substrate which is laminated on the first chip-mounting substrate and on which at least one semiconductor chip is mounted, a plurality of relay terminals electrically connected to the respective terminals of the semiconductor chip are disposed to surround a portion with the semiconductor chip mounted thereon from the outside in the vicinity of the portion, and at least one of the semiconductor chips has a side edge rotated by a predetermined angle from a mutual parallel state with respect to an arrangement opposite to the side edge of the semiconductor chip in a whole arrangement of the relay terminals.

Moreover, according to one aspect of the present invention, there is provided a laminated-chip semiconductor device comprising: a plurality of semiconductor chips having a plurality of terminals; and a plurality of chip-mounting substrates on each of which at least one of the semiconductor chips is mounted, a plurality of relay terminals electrically connected to the respective terminals of the semiconductor chip are disposed to surround a portion with the semiconductor chip mounted thereon from the outside in the vicinity of the portion, and at least one of the semiconductor chips has a side edge rotated by a predetermined angle from a mutual parallel state with respect to an arrangement opposite to the side edge of the semiconductor chip in a whole arrangement of the relay terminals in at least one of two or more laminated layers.

Furthermore, according to one aspect of the present invention, there is provided a laminated-chip semiconductor device comprising: a plurality of semiconductor chips having a plurality of terminals; and a plurality of chip-mounting substrates on each of which at least one of the semiconductor chips is mounted, a plurality of relay terminals electrically connected to the respective terminals of the semiconductor chip are disposed to surround a portion with the semiconductor chip mounted thereon from the outside in the vicinity of the portion, and at least one of the semiconductor chips has a side edge rotated by a predetermined angle from a mutual parallel state with respect to at least two predetermined layers among two or more laminated layers.

Additionally, according to one aspect of the present invention, there is provided a semiconductor device comprising: a semiconductor chip; one or a plurality of chip-mounting substrates on which at least one semiconductor chip is mounted, and which is constituted by laminating one to three layers along a thickness direction; and at least one pair of packaging members which are formed of predetermined materials and which are disposed around the semiconductor chip mounted on at least one layer of the chip-mounting substrate among the semiconductor chips mounted on the layers of the chip-mounting substrates so as to be symmetric with each other with respect to the semiconductor chip in the layer with the semiconductor chip disposed therein.

Moreover, according to one aspect of the present invention, there is provided a semiconductor device comprising: a semiconductor chip; one or a plurality of chip-mounting substrates on each of which at least one semiconductor chip is mounted, and each of which is constituted by laminating one or a plurality of layers along a thickness direction; and at least three pairs of packaging members which are formed of predetermined materials and which are disposed around the semiconductor chip mounted on at least one layer of the chip-mounting substrate among the semiconductor chips mounted on the layers of the chip-mounting substrates so as to be symmetric with one another with respect to the semiconductor chip in the layer with the semiconductor chip disposed therein.

DETAILED DESCRIPTION OF THE INVENTION (First Embodiment)

A laminated-chip semiconductor device according to a first embodiment of the present invention will be described hereinafter with reference to FIGS. 1 and 2.

Figure 1:
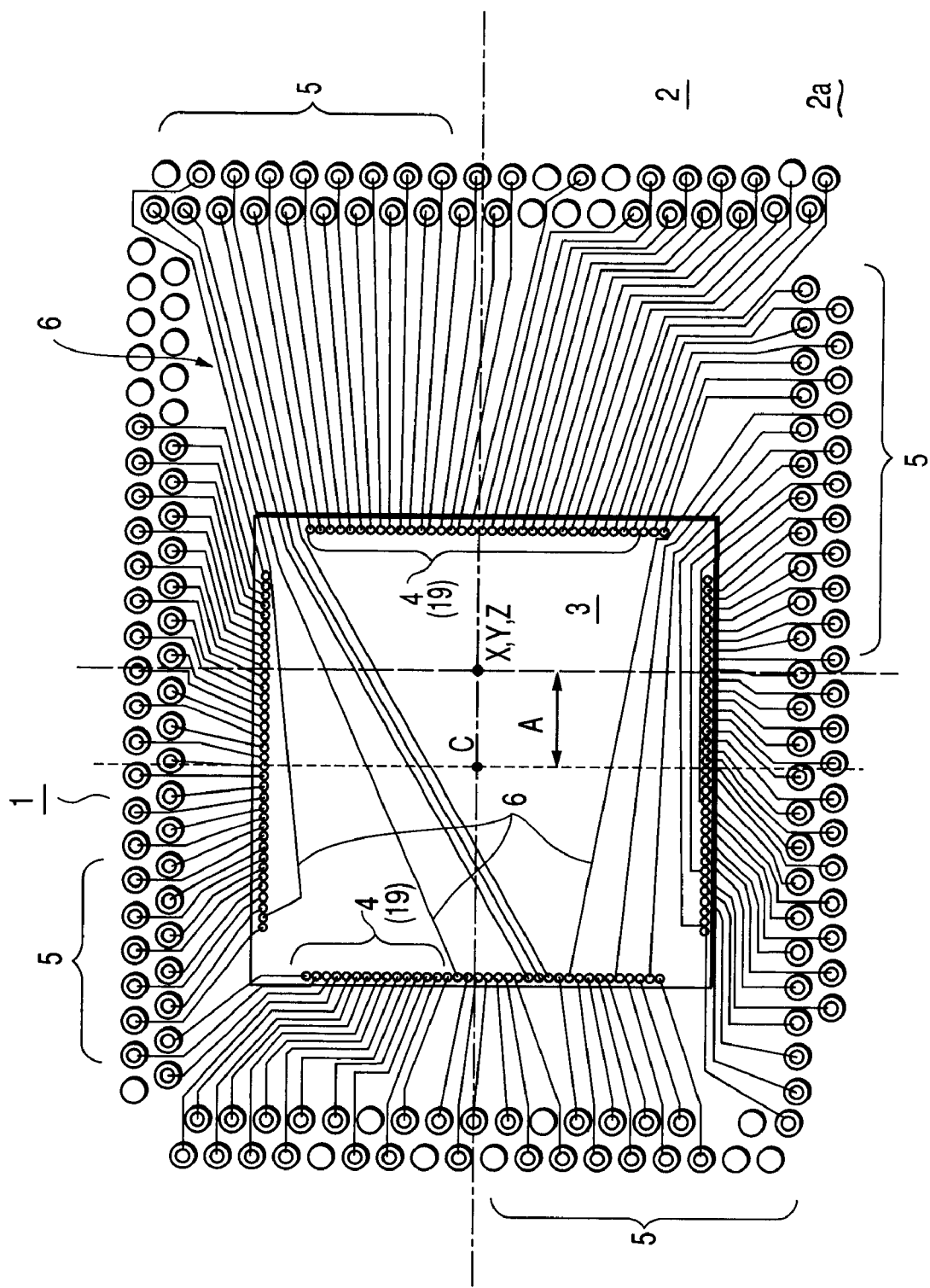
FIG. 1 is a plan view showing a mounting state of a semiconductor chip onto a substrate in a laminated-chip semiconductor device according to a first embodiment of the present invention.

FIG. 1 is a plan view showing a laminated-chip semiconductor device 1 according to the first embodiment of the present invention, and shows the mounting state of a semiconductor chip 3 on a substrate 2. FIG. 2 is a sectional view showing a part of a laminate structure of the semiconductor device 1.

The semiconductor device of the first embodiment is constituted by combining a plurality of semiconductor chips 3 and chip-mounting substrates (chip packaged substrates) 2. An outline of a multi-chip package as the semiconductor device 1 will first briefly be described with reference to FIG. 2. The multi-chip package 1 is also called a multi-chip module, or a multi-block module. In the following description, the multi-chip package 1 will simply be referred to as "the package 1".

The package 1 is constituted by laminating three semiconductor chips 3 and three chip-mounting substrates 2 in three layers in a thickness direction. Each chip 3 is mounted (packaged) on the substrate 2. The chip 3 is mounted on the substrate 2 from the same direction along a laminate direction, for example, by a flip chip method. Concretely, the substrate 2 is laminated such that a first main surface 2a with wiring 6 and pads 19 disposed therein as described later faces downwards, as in FIG. 2. The chip 3 is mounted on the substrate 2 such that a device surface 3a with a plurality of terminals (not shown) disposed therein is disposed opposite the first main surface 2a of the substrate 2 in FIG. 2. In this state, each terminal is electrically connected to the pads 19.

Each substrate 2 includes a plurality of relay terminals 5 electrically connected to the terminals of the chip 3 via the pad 19 and wiring 6. Concretely, there are two types of relay terminals 5. One type of relay terminal is passed through a thickness direction of the substrate 2 and formed as a so-called via terminal (via plug), and the other type of relay terminal is formed simply as a via land on the first main surface 2a of the substrate 2. The relay terminal 5 is formed in a shape of either one of the two types so that the relay terminal electrically connects each terminal of the chip 3 to an external terminal 15 disposed in a ball layer substrate 12 described later via the pad 19 and wiring 6.

Three intermediate substrates 7 are disposed alternately with three substrates 2 and laminated on the first main surfaces 2a of the substrates 2. The package 1 has a three-layered laminate structure in which each one of three substrates 2 each loaded with one chip 3 is disposed alternately with each one of the three intermediate substrates 7. The intermediate substrate (prepreg) 7 is formed as a type of insulating substrate, for example, using a glass epoxy substrate formed by impregnating a glass cloth with resin. A so-called chip cavity 9 is formed opposite the chip 3 of the intermediate substrate 7 so that the intermediate substrate 7 and chip 3 are prevented from interfering with each other in a laminated state. Additionally, the thickness of the intermediate substrate 7 is formed so that the chip 3 does not contact the adjacent substrate 2 in the laminated state.

In the intermediate substrate 7, a plurality of interlayer connection terminals 8 passed through the thickness direction are disposed to electrically connect each terminal of the chip 3 to the external terminal 15 of the ball layer substrate 12. The interlayer connection terminal 8 is formed as the via plug similarly as some of the relay terminals 5. A plurality of interlayer connection terminals 8 are disposed in predetermined positions and substantially vertically aligned in the laminate direction, so that the interlayer connection terminal is electrically connected to the relay terminal 5, to form a conductive path. Additionally, in the first embodiment, the interlayer connection terminal 8 is passed through the thickness direction of the intermediate substrate 7 only in a portion which contributes to formation of the conductive path, and is not disposed in a portion which does not contribute to the formation of the conductive path. Moreover, in the intermediate substrate 7, an intermediate wiring 18 for forming a conductive path with the interlayer connection terminal 8 is formed at a certain position.

One surface substrate 10 is disposed on one side of the laminate direction, that is, an upper side (surface side) of the package 1. The surface substrate 10 is formed in a three-layered structure by an insulating material, and prevents the package 1 from short-circuiting. Moreover, the surface substrate 10 also protects an internal structure of the package 1, particularly the three chips 3, from external impact.

Moreover, each power supply ground substrate 11 and ball layer substrate 12 are disposed on the other side of the laminate direction, that is, on a lower side (back surface side) of the package 1.

A plurality of power supply grounding wirings 13 are formed in respective predetermined wiring patterns in the power supply ground substrate 11, and the surface area of the power supply grounding wiring is formed to be much broader than that of the wiring 6 of the chip-mounting substrate 2 or the intermediate wiring 18 of the intermediate substrate 7. Since the surface area of the power supply grounding wiring 13 is formed to be much broader than that of the wiring 6 or the intermediate wiring 18, electric noise generated inside the package 1 can be effectively suppressed or removed. Moreover, a plurality of ground via terminals 14 are passed through the thickness direction of the power supply ground substrate 11 to constitute a part of the conductive path. Each via terminal 14 is disposed in a certain position so that it is aligned with each relay terminal 5 and interlayer connection terminal 8 in the laminate direction.

A plurality of external terminals connecting wirings 17 for electrically connecting each terminal of the chip 3 to each external terminal 15 in a certain conducive path are formed in a predetermined wiring pattern in the ball layer substrate 12. The respective connecting wirings 17 are electrically connected to a plurality of external terminals (bumps) 15 disposed on the back surface of the ball layer substrate 12. Additionally, only one of a plurality of external terminals 15 is shown in FIG. 2. Moreover, a plurality of external terminals connecting via terminals 16 are passed through the thickness direction of the ball layer substrate 12 and disposed to constitute a part of the conductive path. Each connecting via terminal 16 is electrically connected to each connecting wiring 17 in a predetermined wiring state. Each connecting via terminal 16 is formed at a certain position such that it is linearly aligned with the each relay terminal 5, interlayer connection terminal 8, and ground via terminal 14, in the laminate direction. Thereby, each terminal of the chip 3 is electrically connected to the external terminal 15.

The mounting of each semiconductor chip 3 onto the chip-mounting substrate 2 will next be described.

In the first embodiment, three chips 3 may be of either the same type or different types. The chips 3 having various sizes, shapes, and structures can be used. For example, MPU, audio DSP, and LSI for controlling various devices may be combined to constitute the chip. Moreover, one of three combinations of the chip 3 and substrate 2 will be described hereinafter. Furthermore, this description also relates to the other two combinations of the chip 3 and substrate 2, thus descriptions thereof are omitted.

As shown in FIG. 1, the substrate 2 is disposed so that the center X of the substrate substantially agrees with the center Z of the whole package 1. The respective relay terminals 5 are arranged in a substantially quadrangular shape so as to surround the center X of the substrate 2 so that the center Y of the whole arrangement (layout) substantially agrees with the center X of the substrate 2. In this manner, as shown by intersections of two two-dot chain lines crossing at right angles to each other in FIG. 1, the package 1 is constituted such that the center Z of the whole package, center X of three chip-mounting substrates 2, and center Y of a plurality of relay terminals 5 substantially agree with one another in plan view. Moreover, the positions of the respective centers X, Y, Z are determined by calculation beforehand, based on respective outer shape sizes and arrangements. Additionally, it is unnecessary to dispose the relay terminals 5 along the whole outer periphery of a chip-mounting portion having a substantially quadrangular shape. For example, the relay terminals may be arranged in an outer peripheral portion extending along two opposite sides of the chip-mounting portion.

The chip 3 is mounted on the chip-mounting substrate 2 in such a manner that the center C of the chip shown by the intersection of two broken lines crossing at right angles to each other in FIG. 1 is offset from the center Y of the whole arrangement of the respective relay terminals 5 in a predetermined direction. That is, the chip 3 is mounted on the substrate 2 in such a manner that the center C of the chip is displaced from the center Y of the whole arrangement of the relay terminals 5 in the predetermined direction, by a predetermined distance, and by parallel movement. In this state, the center C of the chip 3 is also offset from the center X of the substrate 2 and the center Z of the whole package 1. The center C of the chip 3 is predetermined based on the outer shape of the chip 3 by a predetermined calculation method similarly as the positions of the centers X, Y, Z.

Here, a mounting position and mounting method of the chip 3 will be described in more detail. Moreover, the mounting position and mounting method of the chip 103 to the substrate 102 according to the prior art shown in FIG. 7 will be referred to as a comparative example.

Figure 7:
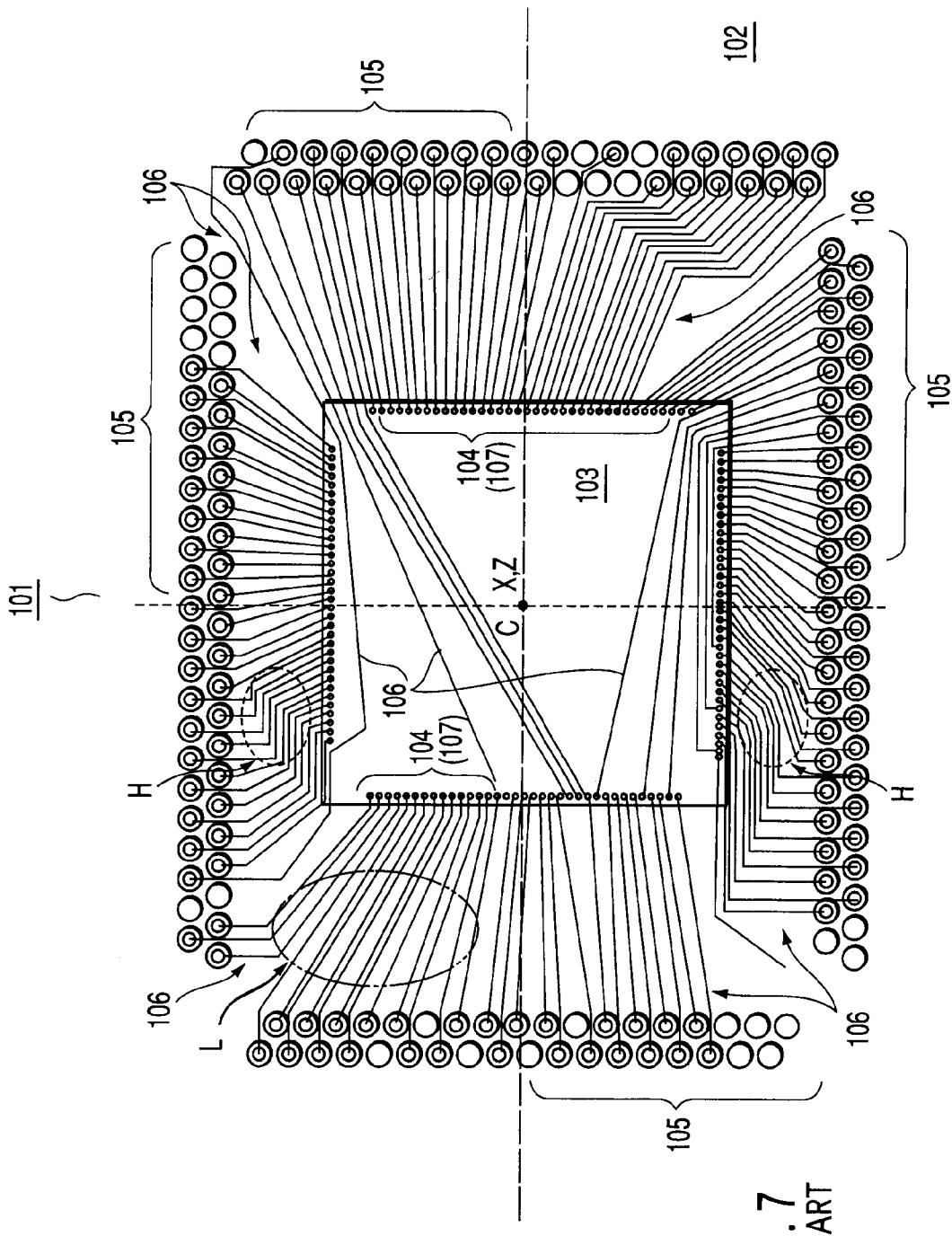
FIG. 7 is a plan view showing the vicinity of a semiconductor chip disposed in a prior art laminated-chip semiconductor device.

According to the prior art, the wiring pattern on the substrate 102 includes a mixture of wirings 106 arranged at coarse intervals as shown by the portion L surrounded with the two-dot chain line of FIG. 7, and the wirings 106 arranged at dense intervals as shown by the portion H surrounded with the broken line in FIG. 7. There is a possibility that such a wiring pattern conflicts with the wiring rule (design rule). To avoid this, in the first embodiment, the mounting position of the chip 3 on the substrate 2 is displaced toward the coarse wiring pattern by a predetermined distance.

Concretely, as shown in FIG. 1, the chip 3 is mounted on the substrate 2 by displacing the center C of the chip from the center X of the substrate 2, the center Y of the whole arrangement of the relay terminals 5, and the center Z of the whole package 1 by a predetermined distance A by parallel movement. That is, the chip 3 is mounted on the substrate 2 in an offset state in the package 1. In the following description, the mounting state of the chip 3 on the substrate 2 will be referred to simply as "the offset state". The distance A of offset of the chip 3 may be set to a predetermined range such that the distance does not conflict with the design rule.

Particularly in the package 1 of the first embodiment, the offset position of the chip 3 may be set to different positions for the respective layers of chips 3.

Figure 2:
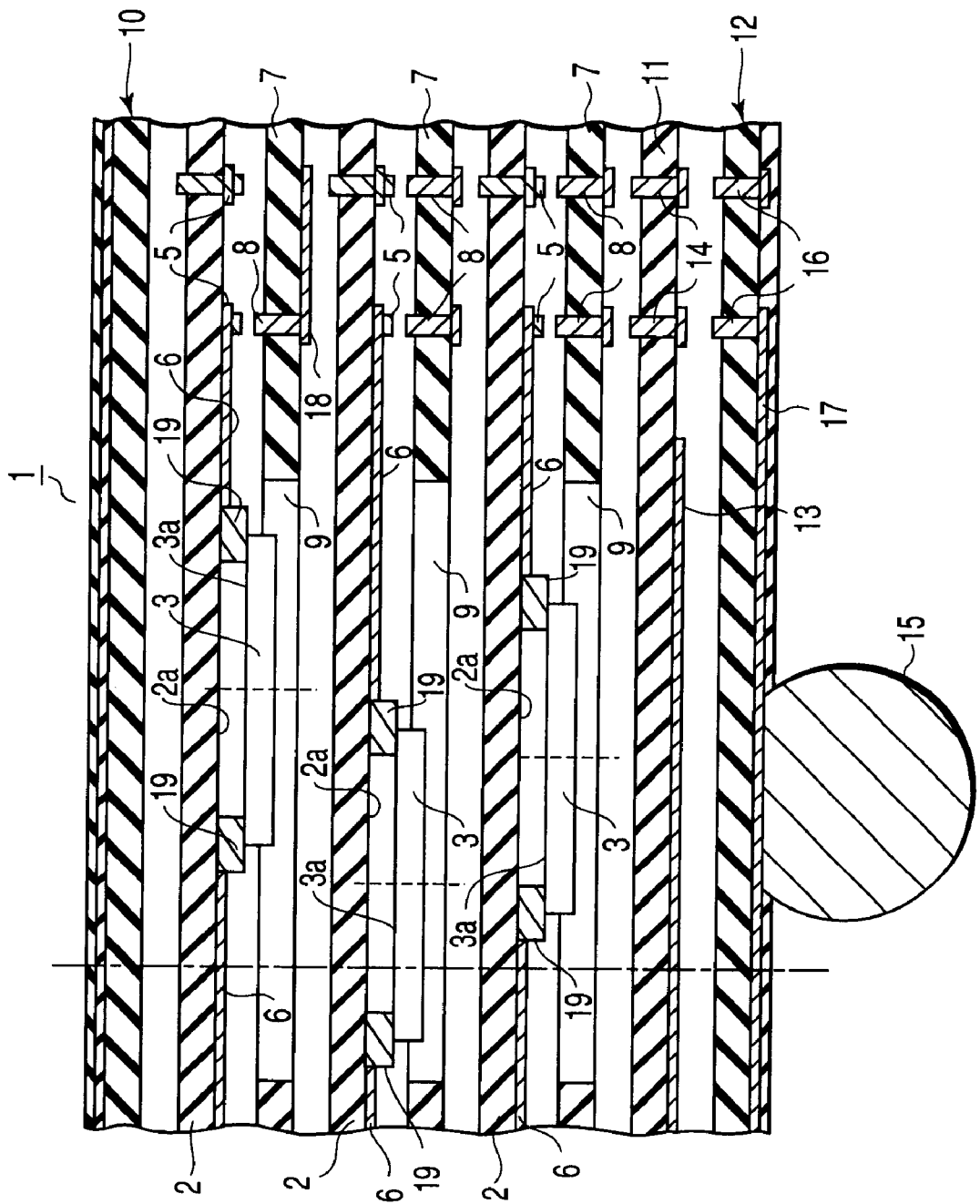
FIG. 2 is a sectional view showing a part of a laminate structure of the laminated-chip semiconductor device according to the first embodiment of the present invention.

For example, for the offset position of the chip 3, the center of the chip 3 shown by a broken line in FIG. 2 may be set to positions displaced by different distances from the center of the substrate 2, center of the whole arrangement of the relay terminals 5, and center of the whole package 1. The mounting position of the chip 3 on the substrate 2 is set to an adequate position for each layer, in accordance with the number of laminations, in consideration of the wiring state, size, and the like of the whole package 1. Moreover, in the mounting state of the first embodiment, for each substrate 2, the first chip-mounting substrate is not particularly different from the second chip-mounting substrate. Furthermore, the second chip-mounting substrate may be interpreted as a substrate constituted by bringing the first chip-mounting substrate into a special chip-mounting state. As described above, the chip 3 is mounted on the substrate 2 in such a manner that the chip is offset to the appropriate position and direction for each layer, so that the degree of freedom in the wiring in the package 1 can be enhanced, and the outer dimensions of the whole package 1 enable it to be compact.

Additionally, for the predetermined layer having a little possibility that the layer conflicts the design rule, the center C of the chip 3 is allowed to substantially agree with the center X of the substrate 2 and the center Z of the whole package 1, and the chip 3 may be mounted on the substrate 2 without being offset. Moreover, the offset direction of the chip 3 may be predetermined such that it does not conflict with the design rule. The direction is not limited as long as the degree of freedom in arranging various wirings in the package 1 can be enhanced. In this case, the chip 3 does not necessarily have to be displaced toward the coarse wiring pattern.

As shown in FIG. 1, when the chip 3 is mounted on the substrate 2, a plurality of pads 19 electrically connected to the plurality of terminals 4 disposed on the chip 3 are formed in a region with the chip 3 mounted thereon on the first main surface 2a of the substrate 2. The same number of pads 19 as the number of terminals 4 are formed opposite the terminals 4 in accordance with the size and shape of the chip 3 and the number and positions of the terminals 4, so that the terminal can individually and directly be connected to the pad. Moreover, the pads 19 are electrically connected to the relay terminals 5 with a one-to-one correspondence via a plurality of chip connection wirings 6. The number of disposed relay terminals 5 is a little larger than the number of pads 19, that is, terminals 4. The relay terminals 5 shown by circle marks in FIG. 1 and not connected to the terminals 4 and pads 19 are used in arranging an interlayer wiring (not shown) when the layers of three chips 3 are electrically connected to one another.

Additionally, in FIG. 1 as a plan view seen from the first main surface 2a of the substrate 2, the terminals 4 and pads 19 hidden by the chips 3 are shown by solid lines. This facilitates an understanding of the electric connection state of the terminal 4 and pad 19 with the relay terminal 5 via the chip connection wiring 6.

According to the first embodiment, as shown in FIG. 1, areas of the wiring 6 which have an excessively coarse wiring density or an excessively dense wiring density can be reduced. Thereby, the degree of freedom in arranging various wirings, including the chip connection wiring 6 in the package 1, can be enhanced without increasing the size of the substrate 2, or conflicting with the design rule.

As shown in FIG. 7, in the prior art in which all the chips 3 are mounted in the middle portion Z of the package 101 in order to minimize the whole size of the module (package) 101, there is little space for the wirings other than the wiring 106 in each layer. Therefore, when a new interlayer wiring is arranged around in the package 101, as a result, the size of one substrate 102 among a plurality of substrates 102 has to be increased.

On the other hand, in the first embodiment, the chip 3 is offset toward the side having a coarse wiring density in the prior art and mounted on the substrate 2 in the range in which the offset does not conflict with the design rule. The offset amount of the chip 3 is set so as to minimize enlargement of the package size required for arranging around the new interlayer wiring. Thereby, the degree of freedom in arranging around the interlayer wiring can be enhanced without increasing the package size, increasing the number of substrates, disposing a new wiring layer, or using a special wiring process. Therefore, the chips 3 of the respective layers can be connected to one another in the desired wiring pattern during lamination of the plurality of chips 3 in the plurality of layers, even for a package 1 whose size, shape, and the like are structurally restricted.

As described above, according to the first embodiment, the package size can be inhibited from increasing and made to be compact irrespective of the type of chip 3 mounted on the substrate 2. Moreover, since the degree of freedom in arranging various wirings in the package 1 can be enhanced, the embodiment can also be applied, for example, to an equal length wiring.

Additionally, in FIGS. 1 and 2, the position and size of the pads 19 are shown to be different. This is because the constitution of the first embodiment shown by each arranging is shown in the intentionally different shapes for ease of understanding. This does not adversely influence the scope of the present invention. Similarly, to implement the present invention, the position and posture of the chip 3 mounted on the substrate 2, the direction, posture, and the like of the intermediate substrate 7 with respect to the substrate 2 and chip 3 are not limited to the states shown in FIGS. 1 and 2. Various directions or postures can be set as long as the scope of the present invention is not adversely affected.

Next, an outline of one example of a manufacturing process of the package 1 of the first embodiment will concretely and briefly be described.

First, three semiconductor chips 3 are disposed opposite the device surfaces 3a one by one on the first main surfaces 2a of three chip-mounting substrates 2. Thereafter, as shown in FIGS. 1 and 2, each chip 3 is mounted in a chip-mounting position predetermined for each layer to obtain an appropriate offset state in the whole multi-chip package 1 on the first main surface 2a of the substrate 2, for example, by the flip chip method.

Subsequently, the substrates 2 with the chips 3 mounted thereon are laminated alternately with three intermediate substrates 7 in three layers in the thickness direction. In this case, each intermediate substrate 7 is disposed so that the chip 3 is held in the chip cavity 9 in the intermediate substrate 7. Moreover, in this case, adhesives (adhesive resins) may be appropriately disposed between each substrate 2 and each intermediate substrate 7, or between the layers including the pair of substrates 2 and intermediate substrate 7.

Next, each laminated substrate 2 and intermediate substrate 7 are held by the surface substrate 10, power supply ground substrate 11, and ball layer substrate 12 from opposite outer sides in the laminate direction. In this case, the respective substrates 2 and intermediate substrates 7, surface substrate 10, power supply ground substrate 11, and ball layer substrate 12 are aligned so that the respective centers substantially agree with the center Z of the whole package 1. Moreover, in this case, as in the aforementioned laminating operation of the substrates 2 and intermediate substrates 7, the adhesive may appropriately be disposed between the surface substrate 10, respective substrates 2 and intermediate substrate 7, power supply ground substrate 11, and ball layer substrate 12.

After the chip mounting and laminating operations are completed, the surface substrate 10, respective substrates 2 and intermediate substrates 7, power supply ground substrate 11, and ball layer substrate 12 are pressed into contact with one another in the laminate direction, obtaining the desired package 1. Thereby, the manufacturing process of the package 1 is ended.

(Second Embodiment)

Figure 3:
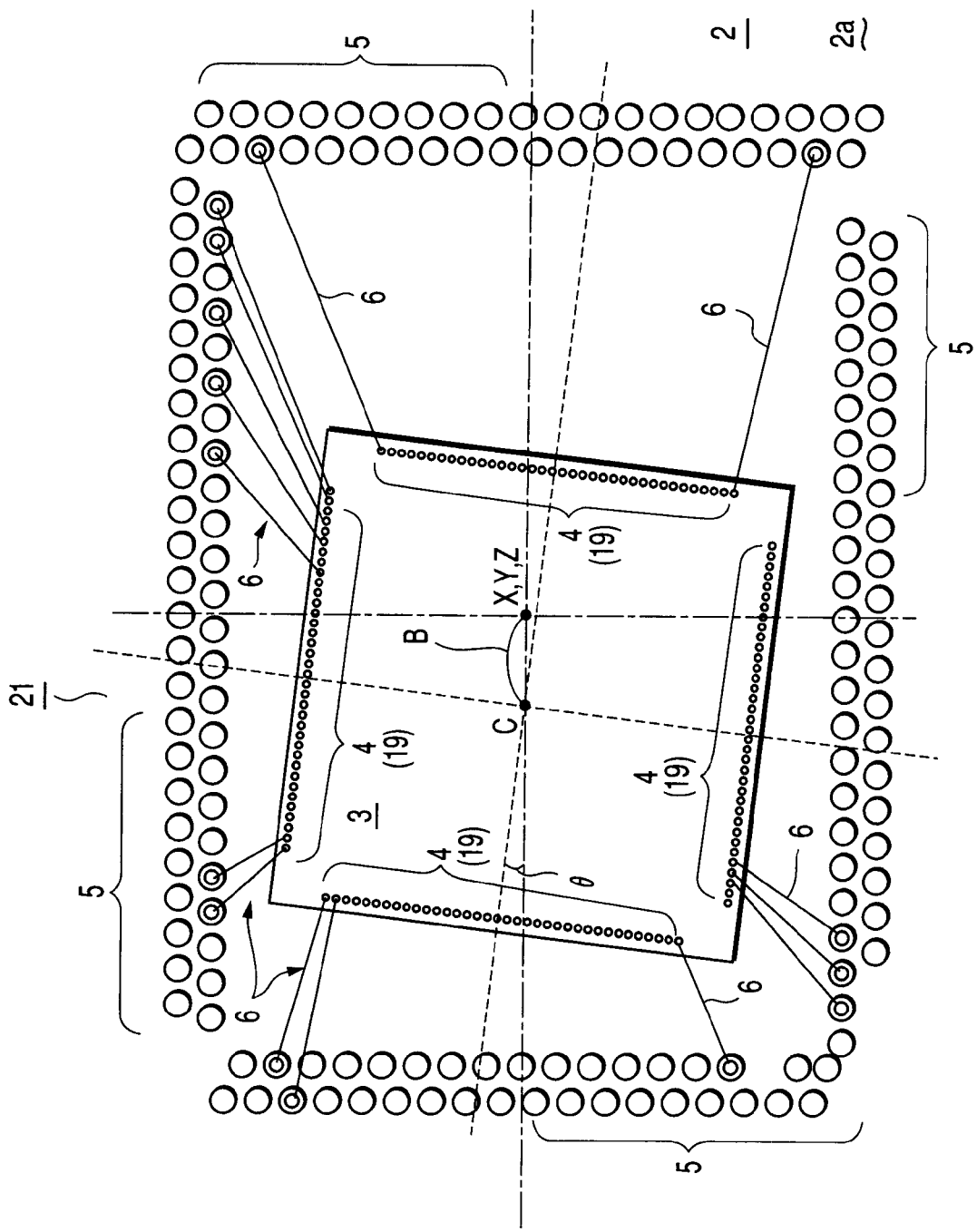
FIG. 3 is a plan view showing the mounting state of the semiconductor chip onto the substrate in the laminated-chip semiconductor device according to a second embodiment of the present invention.

The laminated-chip semiconductor device according to a second embodiment of the present invention will next be described with reference to FIG. 3. FIG. 3 is a plan view showing the mounting state of the semiconductor chip 3 onto the chip-mounting substrate 2 in a semiconductor device 21 according to the second embodiment. Additionally, the same constituting components as those of the first embodiment are denoted with the same reference numerals and the description thereof is omitted.

One of a plurality of combinations of the semiconductor chip 3 and chip-mounting substrate 2 of the multi-chip package 21 as the semiconductor device of the second embodiment will be described hereinafter. Moreover, this description also applies to other combinations of the chip 3 and substrate 2, thus the other combinations will not be described.

As shown in FIG. 3, the chip 3 of the second embodiment is formed in a substantially quadrangular, in plan view. The respective relay terminals 5 are arranged to form the whole arrangement having the substantially quadrangular shape as viewed in the plane so that the relay terminals 5 uniformly surround the portion with the chip 3 mounted thereon from the outside. The chip 3 is mounted on the substrate 2 in such a manner that the center C of the chip is displaced from the center X of the substrate 2, center Y of the whole arrangement of the relay terminals 5, and center Z of the whole package 21 by a predetermined distance B in a predetermined direction by parallel movement. Moreover, the chip 3 is mounted on the substrate 2 in such a manner that one edge of the chip is rotated to an inclined state from a parallel state by a predetermined angle θ with respect to the arrangement of side frame portions of the relay terminals 5 disposed opposite the edge of the chip. That is, the chip 3 is mounted on the substrate 2 in such a manner that the four edges of the chip are rotated from the parallel state, by the predetermined angle θ with respect to the arrangement of four side frames of each relay terminal 5 disposed opposite the side edges of the chip. Therefore, the chip 3 is mounted on the substrate 2 in the displaced and rotated offset state in the package 21.

Additionally, it is unnecessary to dispose the relay terminals 5 along the whole outer periphery of the chip-mounting portion having the substantially quadrangular shape. For example, the relay terminals may be arranged only in an outer peripheral edge extending along two opposite sides of the chip-mounting portion.

In the package 21, the offset distance B and rotation angle θ of the chip 3 may be set independently for the respective layers, as long as the values do not conflict the design rule. For example, the centers C of two chips 3 are displaced in the distance and direction which differ with the respective layers in at least two substrates 2 of a plurality of substrates 2. Moreover, two chips 3 may be rotated at different angles. The offset distance B and rotation angle θ of the chip 3, that is, the mounting position and posture of the chip 3 on the substrate 2 are determined in the appropriate positions for each layer in accordance with the number of laminations, and in consideration of the wiring state and size of the whole package 21. In this manner, the chip 3 is mounted on the substrate 2 offset in a appropriate position, direction, and posture for each layer, so that the degree of freedom in the wiring in the package 21 can be enhanced, and the package 21 can be made compact.

Therefore, when the possibility of conflict with the design rule is low, and problems do not easily occur in the wiring in the package 21, the chip 3 may merely be rotated and disposed on the substrate 2, without being displaced. Moreover, a certain layer of the chip 3 may be mounted on the substrate 2, without being moved in parallel or rotated.

The same number of pads 19 as terminals 4 are formed in the region where the chip 3 is offset-mounted on the first main surface 2a of the substrate 2. The pads 19 are disposed opposite the terminals 4, in accordance with the size, shape, and posture of the mounted chip 3, or the number and positions of the terminals 4. That is, the pads 19 are disposed such that the pads can individually, directly, and electrically be connected to the terminals 4 in accordance with the offset distance B and rotation angle θ of the chip 3.

Additionally, in FIG. 3 as a plan view seen from the first main surface 2a of the substrate 2, the terminals 4 and pads 19 hidden by the chips 3 are shown by the solid lines. This facilitates an understanding of the electric connection state of the terminal 4 and pad 19 with the relay terminal 5 via the chip connection wiring 6. Moreover, only some of the plurality of chip connection wirings 6 for electrically connecting the pads 19 to the relay terminals 5 are shown, but this does not adversely affect the scope of the present invention. Furthermore, to implement the present invention, the position, posture, and the like of the chip 3 mounted on the substrate 2 are not limited to those shown in FIG. 3. Various positions and postures can be set as long as the scope of the present invention is not adversely affected.

As described above, according to the second embodiment, as in the first embodiment, portions having an excessively coarse or dense wiring density are substantially removed in the wiring pattern of the chip connection wiring 6. Thereby, the degree of freedom in arranging various wirings in the package 21 can be remarkably enhanced without increasing the outer size of the substrate 2 or conflicting with the design rule. Therefore, according to the package 21 of the second embodiment, the whole package can be made more compact, irrespective of the type of chip 3 mounted on the substrate 2. Moreover, of course, the second embodiment can also be applied to an equal length wiring.

Furthermore, according to the second embodiment, as shown in FIG. 3, the pad 19 can be electrically connected to the relay terminal 5 in the wiring pattern in which the wiring distance of each layer is shortened. Additionally, the wiring distance of the whole package 21 can be shortened. Therefore, the package 21 can be reduced in cost, the possibility of short-circuit or disconnection is reduced, and safety, reliability, and the like can be enhanced.

(Third Embodiment)

Figure 4:
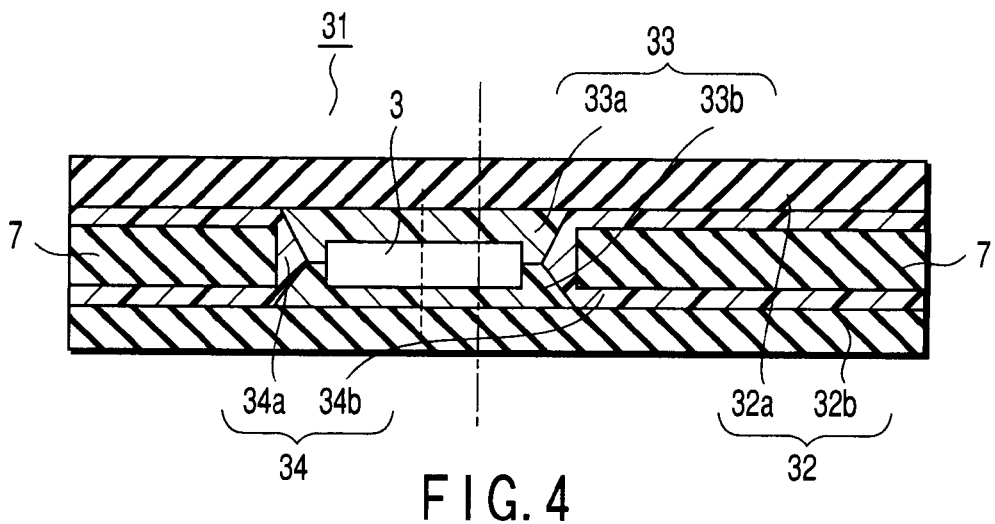
FIG. 4 is a sectional view schematically showing a part of the laminate structure of the semiconductor device according to a third embodiment of the present invention.

The semiconductor device according to a third embodiment of the present invention will next be described with reference to FIG. 4. FIG. 4 is a sectional view schematically showing a part of the laminate structure of a semiconductor device 31 according to the third embodiment. Additionally, the same constituting components as those of the first embodiment are denoted with the same reference numerals, and a description thereof is omitted.

First, a peripheral structural problem of the semiconductor chip 103 in the prior-art semiconductor device will be described with reference to FIGS. 8 to 10 prior to the description of the semiconductor device 31.

Some of the prior-art semiconductor devices have a package structure in which the semiconductor chip is sealed from the outside. In this type of semiconductor device, it is general to use a lead frame as a wiring base material, or to use a copper wiring on a resin substrate as the wiring base material.

Figure 8:
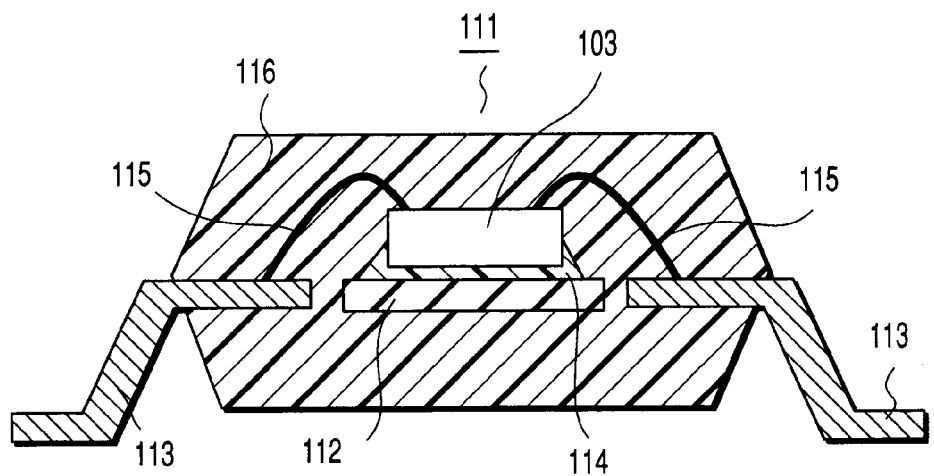
FIG. 8 is a sectional view showing a prior art semiconductor device.

As one example of the semiconductor device, for example, FIG. 8 shows a so-called resin molded package 111 in which a lead frame 113 is used as the wiring base material. In the package 111, the semiconductor chip 103 is fixed (mounted) on a chip-mounting lead frame 112 via an adhesive member 114 called a "mount material". Moreover, the chip 103 fixed onto the lead frame 112 is electrically connected to the lead frame 113 by a bonding wire 115, for example, of gold (Au) or the like. The chip 103 as well as the lead frame 112, and the like are surrounded from the outside and coated and sealed with a molded resin 116. In this case, it is general to use a conductive paste in the adhesive member 114, and silver filler particles are scattered in the resin.

Figure 9:
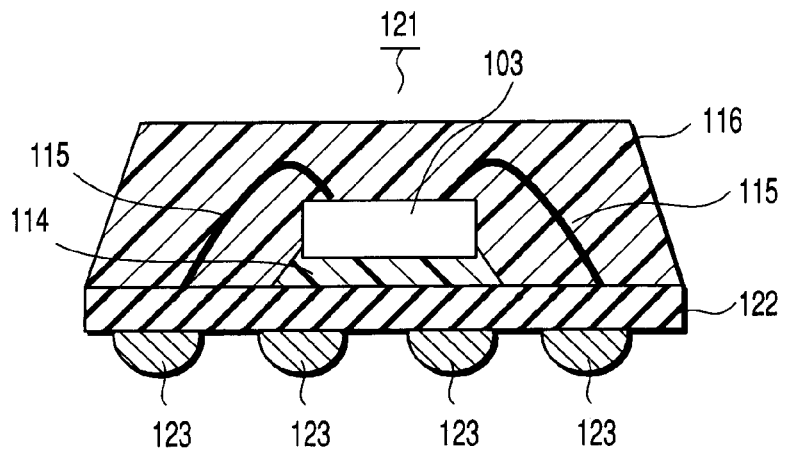
FIG. 9 is a sectional view showing another example of a prior art semiconductor device.

Moreover, as another example of the semiconductor device, FIG. 9 shows a so-called over molded type package 121 in which a resin substrate 122 such as a polyimide or glass epoxy substrate is used. In the package 121, the chip 103 is fixed onto one surface of the resin substrate 122 for external connection via the mount material 114. The chip 103 is electrically connected to a plurality of external connection terminals (bumps) 123 disposed on the other surface of the resin substrate 122 via the bonding wire 115. Moreover, in the package 121, only the side of the resin substrate 122 with the chip 103 fixed thereto is coated and sealed with the molded resin 116.

Figure 10:
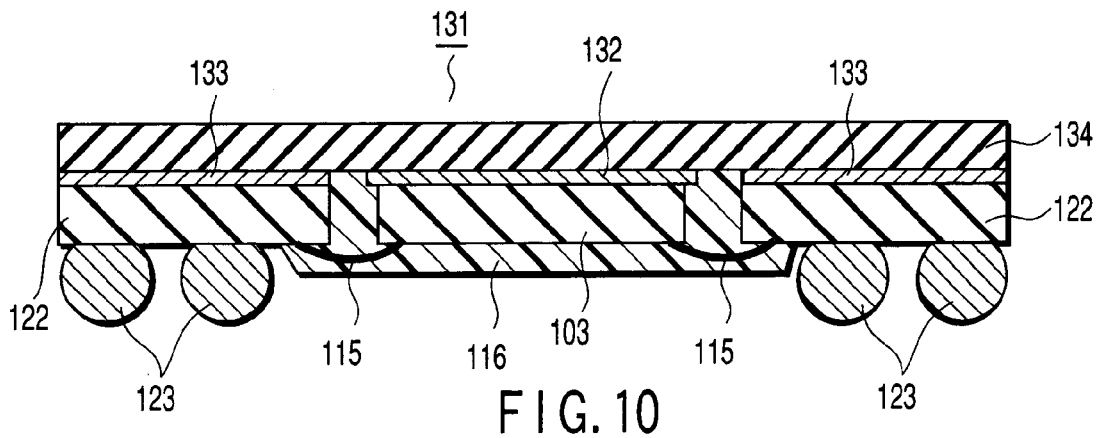
FIG. 10 is a sectional view showing another example of a prior art semiconductor device.

Furthermore, as another example of the semiconductor device, FIG. 10 shows a so-called enhanced BGA type package 131 in which a device hole for mounting the chip is formed in a middle portion. In the package 131, a chip-mounting frame 132 formed of a metal such as copper is bonded to the middle portion of one surface of a resin substrate 134 such as a glass epoxy substrate. Frames 133, similarly formed, for connecting the external terminals, are bonded on opposite sides of the mounting frame 132. Resin substrates 122 for the external connections are bonded on the surfaces of the connecting frames 133 opposite the resin substrate 134. Moreover, a plurality of external connection terminals 123 are disposed on the surfaces of the resin substrates 122 opposite the connecting frames 133. The chip 103 is fixed onto the surface of the mounting frame 132 opposite the resin substrate 134 via a mounting agent (not shown). The chip 103 is electrically connected to the external connection terminals 123 via the bonding wires 115. In the package 131, only the vicinity of the chip 103 is coated and sealed with the molded resin 116.

In the respective packages 111, 121, 131 of FIGS. 8 to 10 formed as described above the type of member disposed above and below the chips 103 differ. Therefore, since the members differ mainly in a thermal expansion coefficient, the whole package may warp. Concretely, when each chip 103 is regarded as the center of the package structure in the respective packages 111, 121, 131, an asymmetric deformation is generated in the chip 103. The cause behind such deformation will be described hereinafter.

For example, the mounting agent 114 for fixing the chip used in common in the three examples of the package structures is left to stand in a high-temperature state so as to be hardened. The temperature at which the mount agent 114 is hardened is generally in the range of about 120° C. to 180° C. Moreover, generally the high hardening temperature is regarded as the temperature of the mount agent 114 in a non-stress state. When the mount agent 114 is cooled down to normal temperature from the high hardening temperature, for example, in the package 111, the bonded portion and peripheral portion of the chip 103 and mounting lead frame 112 asymmetrically warp due to differences in the thermal expansion coefficients of the chip 103 and mounting lead frame 112. This phenomenon is common to the package 121 and 131.

Moreover, a complicated warp is generated due to the influence of the thermal expansion coefficient and thermoset contraction ratio of the mounting agent 114. Furthermore, in each of the packages 111, 121, 131, when the chip 103 is coated with the resin 116 and hardened, at about 120° C. to 180° C., the thermal expansion coefficient and thermoset contraction ratio of the molded resin 116 also exert influences. Therefore, complicated stresses are further generated, and the chip-mounting portion and peripheral portion warp in a highly complicated manner. When this stress is generated, it is easily concentrated in the interface members of each of the packages 111, 121, 131, which leads to damage of the member, the chip 103, or other problems. This may mean that the device cannot be used.

The third embodiment relates to the structure of a semiconductor device, made in consideration of the aforementioned problems, and provides a semiconductor device including a package structure in which local stresses do not easily concentrate and in particular the semiconductor chip is protected from asymmetric warp.

The single chip package semiconductor device 31 of a third embodiment will be described hereinafter with reference to FIG. 4. Additionally, in FIG. 4, to facilitate the reading of the arranging and the understanding of the constitution of the package 31, the surface substrate and ball layer substrate are omitted. A description of these substrates is also omitted.

The package 31 includes the semiconductor chip 3 and chip-mounting substrate (not shown), and has a sectional structure shown in FIG. 4. As in the semiconductor devices 1, 21 of the first and second embodiments, the chip 3 is disposed in the package 31 in such a manner that the center of the chip shown by a broken line of FIG. 4 is offset from the center of the whole package 31 shown by a one-dot chain line in FIG. 4, by parallel movement or rotation.

A first packaging member 33 is disposed around the chip 3 so as to hold and wrap the chip 3 from the outside of the laminate direction, that is, a vertical direction in FIG. 4. The first packaging member 33 is constituted of an upper first packaging member 33a and lower first packaging member 33b. The upper and lower first packaging members 33a, 33b are disposed to be symmetric with each other in the vertical direction with respect to the chip 3. Both the upper and lower first packaging members 33a, 33b are formed of organic materials having the same physical properties. Moreover, for the upper and lower first packaging members 33a, 33b, materials whose elastic modulus, glass transition temperature, Poisson ratio, and thermal expansion coefficient are set to appropriate values are selected in order to suppress the stress generated by bonding the members with the chip 3, and the thermal expansion coefficient difference between an external member (not shown) and the chip 3. The bonding strength is a particularly important item (parameter).

Furthermore, on the opposite outer sides of the upper and lower first packaging members 33a, 33b, a resin substrate 32 such as a prepreg formed by impregnating a glass cloth with resin, that is, a so-called glass epoxy substrate, is disposed to hold the chip 3 via the upper and lower first packaging members 33a, 33b. The resin substrate 32 is constituted of upper and lower resin substrates 32a and 32b, and constitutes a part of the packaging member of the package 31. The upper and lower resin substrates 32a and 32b are disposed to be symmetric with each other in the vertical direction of the chip 3. Moreover, the upper and lower resin substrates 32a and 32b are formed of organic materials having the same physical properties. The upper and lower resin substrates 32a and 32b correspond to the chip-mounting substrate 2 in the packages 1, 21 of the first and second embodiments. That is, the substrate 2 described in the first and second embodiments is set so as to constitute a part of the packaging member in the package 31.

Furthermore, around the chip 3 in FIG. 4, the intermediate substrates 7 are disposed symmetrically with respect to the chip 3 outside a lateral direction of the chip 3 as a direction crossing at right angles to the laminate direction of the chip 3, that is, outside back-to-forth and right-to-left directions of the chip 3. Additionally, the intermediate substrates 7 are disposed around the chip 3 so that the chip 3 is held in the middle portion of the chip cavity. The intermediate substrate 7 also constitutes a part of the packaging member in the package 31, and functions as a so-called third packaging member. Moreover, wiring (not shown) is formed on the intermediate substrate 7, and the material thereof is selected for the purpose of guaranteeing the thickness corresponding to the chip 3. In the third embodiment, it is assumed that the intermediate substrate 7 is formed of an organic material similar to that of the resin substrate 32 (such as a prepreg formed by impregnating glass cloth with resin, that is, a so-called glass epoxy substrate). Additionally, for the back-to-forth direction of the chip 3 in FIG. 4, a front side of a paper surface on the basis of the chip 3 is assumed to be a front side, and an inner side of the paper layer on the basis of the chip 3 is assumed to be a back side.

Moreover, a second packaging member 34 formed of an organic material is disposed around the chip 3, as in the intermediate substrate 7, so that the members are symmetrically positioned outside the back-to-forth and left-to-right directions of the chip 3 in FIG. 4. Concretely, the second packaging member 34 is disposed to surround the chip 3 from the outside of the back-to-forth and left-to-right directions of the upper and lower first packaging members 33a, 33b. As shown in FIG. 4, the second packaging member 34 is constituted of left and right packaging members 34a and 34b. Additionally, in actual fact, as in the intermediate substrate 7, the packaging members are integrally disposed to surround the peripheries of the chip 3 and upper and left first packaging members 33a, 33b from the outside of the back-to-forth and left-to-right directions. That is, the left and right second packaging members 34a, 34b are integrally formed of one type of material in the actual package 31.

In FIG. 4, to aid an understanding of the arrangement of the respective packaging members 33, 34, 7, the originally integral second packaging member 34 is divided, shown by the left and right packaging members 34, 34b. The third embodiment will be described with reference to FIG. 4.

The left and right second packaging members 34a, 34b are disposed to be symmetric with each other in respect to the chip 3 and upper and lower first packaging members 33a, 33b. In this case, the left and right second packaging members 34a, 34b are disposed so as to fill the gaps between the upper and lower first packaging members 33a, 33b, upper and lower resin substrates 32a, 32b, and intermediate substrate 7. The left and right second packaging members 34a, 34b are formed of the same material, and have the same physical properties as those of the upper and lower first packaging members 33a, 33b in the third embodiment. Moreover, the materials of the left and right second packaging members 34a, 34b are selected for the purpose of filling in the gaps between the upper and lower first packaging members 33a, 33b and intermediate substrate 7; securing the bonding strength, and suppressing the stress generated by differences in thermal expansion coefficients.

As described above, in the package 31, the respective packaging members 32a, 32b, 33a, 33b, 34a, 34b, 7 are disposed to be symmetrically equivalent in structure and material with respect to the chip 3. That is, in the package 31, the peripheral members of the chip 3 are constituted to be three-dimensionally symmetric both in structure and material, with respect to the chip 3.

The package 31 has a one-layer structure constituted of a pair of chips 3 and substrates, and formed to be remarkably thin. Moreover, since the center of the chip 3 is offset from the center of the whole package 31, the package 31 is formed in the asymmetric structure with respect to the chip 3 regarded as the center. In spite of this structure, the symmetrical structures around the chip 3 can satisfactorily prevent the package 31 from being deformed by warps or strain created around the chip 3. Moreover, if a deformation is caused by warps or the strain in the package 31, the stress caused by the deformation is uniformly scattered by the symmetric structure around the chip 3, without being concentrated on the chip 3. Furthermore, the strength of the whole package 31 is enhanced.

The present inventors actually designed and manufactured thin laminated semiconductor devices having one to three layers and conducted experiments using the semiconductor device of the third embodiment. As a result, it can be understood that deformations due to warps or strains of the chip-mounting substrate in each layer and deformations in the whole semiconductor device can be satisfactorily suppressed, without disposing special reinforcement structures or components inside the semiconductor device and without having to thickly mold each chip-mounting substrate. It can also be understood that, on the occurrence of a deformation, the resulting load is not easily concentrated on at specific positions in the semiconductor device. Concretely, it has been seen that the deformation is caused with the chip 3 of each layer as the symmetry center of the deformation, and therefore the load generated by the deformation individually and uniformly acts on each chip 3 in each layer.

As described above, according to the third embodiment, the degree of freedom in arranging around the inner wiring of the semiconductor device 31 can be enhanced, and the whole semiconductor device 31 can be made more compact. Moreover, the load is not easily applied to the chip 3, and the strength of the whole semiconductor device 31 can be enhanced. Therefore, the stability and reliability of the semiconductor device 31 can be further enhanced. Moreover, the semiconductor device 31 has a long life.

The asymmetric structure in the package 31 in which the chip 3 is offset from the center of the whole package 31 has been described above. Even in this asymmetric structure of the package 31, an excellent deformation-inhibiting effect can be obtained. Therefore, when the center of the chip 3 substantially agrees with the center of the whole package 31, that is, when the package 31 is formed in the symmetric structure, the deformation inhibiting effect of the package 31 is further increased. Furthermore, the package 31 having a symmetrical inner structure with respect to the chip 3 as the center has been described, but is not limited to this structure. For example, in FIG. 4, the respective packaging members may be disposed to be symmetric with one another with respect to the chip 3 both in a physical property respect and the structure respect in the vertical, left-to-right, and back-to-forth directions of the chip 3.

Furthermore, the pairs of packaging members 32a, 32b, 33a, 33b, 34a, 34b, 7 may be formed of different materials. Additionally, a plurality of pairs of packaging members 32a, 32b, 33a, 33b, 34a, 34b, 7 may be disposed in different positions so as to be symmetric with each other with respect to the chip 3. In this case, among the respective pairs of the packaging members 32a, 32b, 33a, 33b, 34a, 34b, 7, a certain pair of packaging members may be formed of the same type of material. The packaging members can be appropriately arranged so that the strength of the whole package 31 can be enhanced to suppress deformations due to warps, strain, and loads caused by deformations can be uniformly scattered and not easily concentrated at specific places, that is, at the chip 3 in the package 31.

(Fourth Embodiment)

Figure 5:
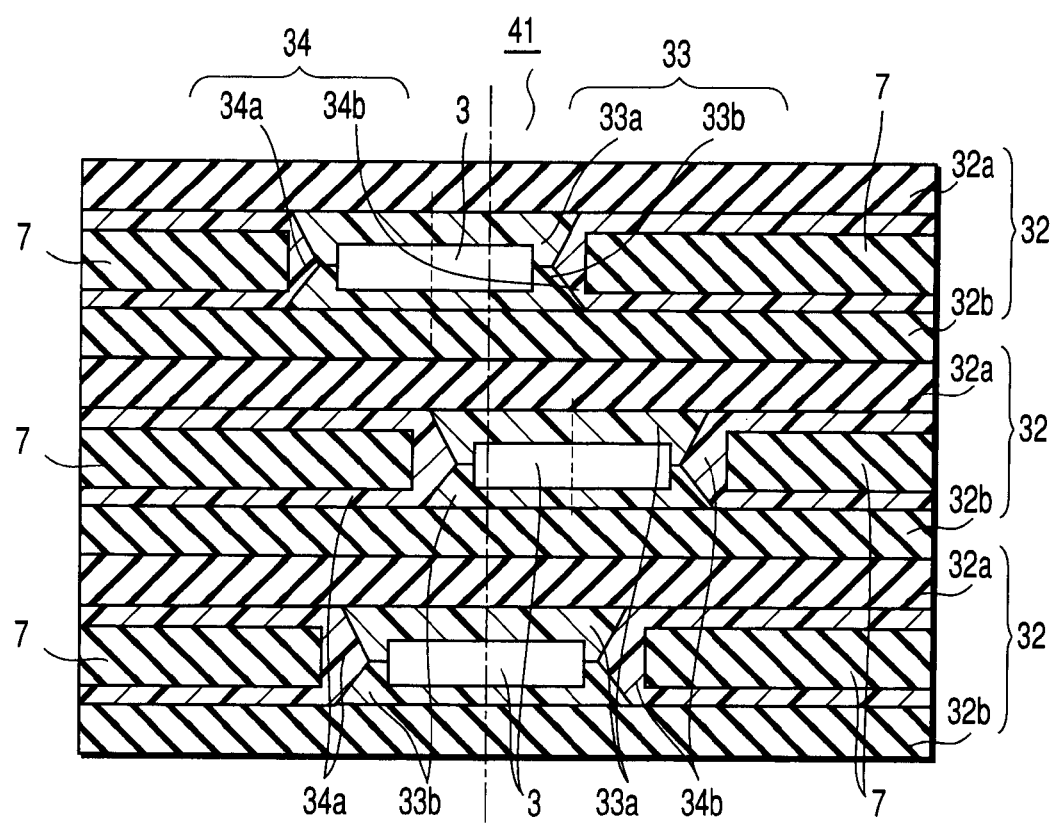
FIG. 5 is a sectional view schematically showing a part of the laminate structure of the laminated-chip semiconductor device according to a fourth embodiment of the present invention.
Figure 6:
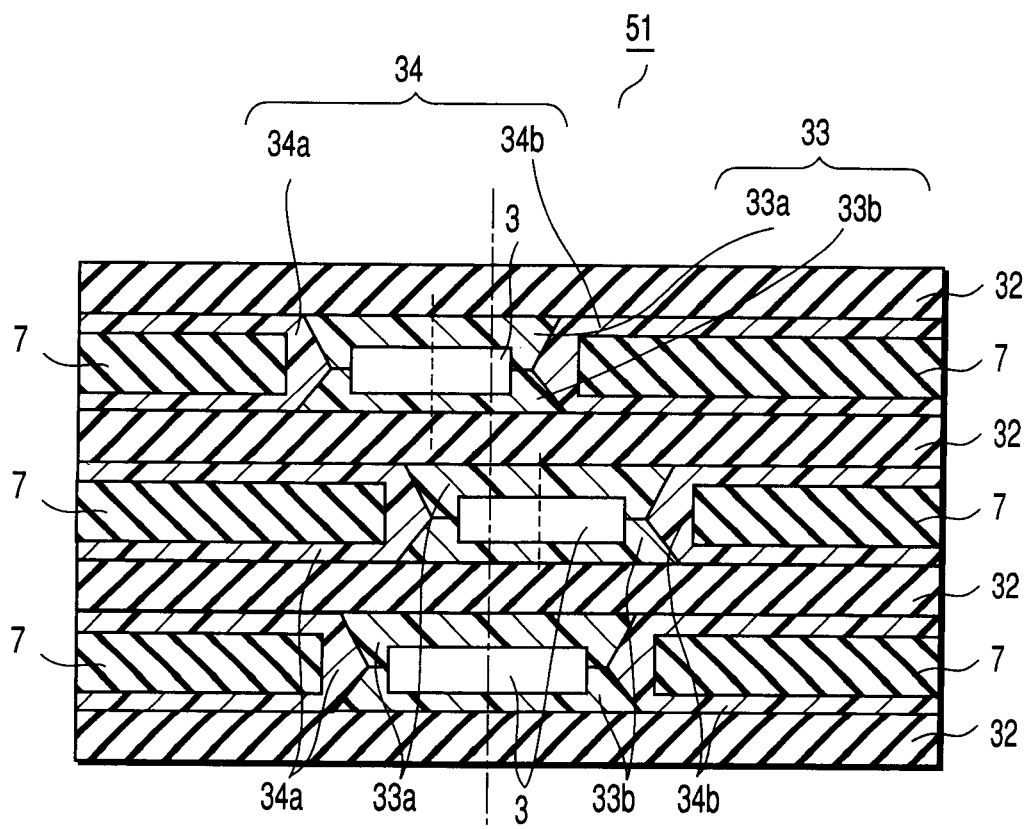
FIG. 6 is a sectional view schematically showing a part of the laminate structure of the laminated-chip semiconductor device according to another example of the fourth embodiment of the present invention.

The laminated-chip semiconductor device according to a fourth embodiment of the present invention will next be described with reference to FIGS. 5 and 6. FIG. 5 is a sectional view schematically showing a part of the laminate structure of a semiconductor device 41 according to the fourth embodiment, and FIG. 6 is a sectional view schematically showing a part of the laminate structure of another semiconductor device 51 according to the fourth embodiment. The description of the fourth embodiment is similar to the third embodiment, and the same constituting components as those of the first embodiment are denoted with the same reference numerals and the description thereof is omitted.

The semiconductor devices 41, 51, as multi-chip packages of the fourth embodiment, are constituted by laminating the semiconductor device 31 of the third embodiment in a plurality of layers, concretely three layers.

First, the package 41 shown in FIG. 5 will be described. The package 41 is constituted by laminating three packages 31 of the third embodiment, with the center of the whole package being the dot-chain line running right through. Each layer of the semiconductor chip 3 is disposed in such a manner that the centers of the layers are displaced from one another. Concretely, in FIG. 5 the chip 3 on the uppermost layer is disposed in such a manner that the center of the chip is displaced toward the left side from the center of the whole package 41 as shown by a broken line of FIG. 5. Moreover, in FIG. 5 the chip 3 on the intermediate layer is disposed in such a manner that the center of the chip is displaced toward the right side from the center of the whole package 41 as shown by another broken line of FIG. 5. Furthermore, in FIG. 5 the chip 3 on the lowermost layer is disposed so that the center of the chip substantially agrees with the center of the whole package 41. In this manner, in the package 41, the chips 3 on the uppermost and intermediate layers are disposed in the offset state. Therefore, the substrates 2 of the intermediate and upper layers form second chip-mounting substrates in the package 41.

The multi-chip package 51 shown in FIG. 6 will next be described. The package 51 is constituted by removing either one of the upper and lower resin substrates 32a, 32b disposed adjacent each other in layers in the package 41. That is, each resin substrate 32 is disposed in a layer in the package 51. Moreover, the substrates 2 disposed in the uppermost and intermediate layers form the second chip-mounting substrates also in the package 51.

Therefore, the packages 41, 51 have an internal structure in which the respective packaging members 32, 32a, 32b, 33a, 33b, 34a, 34b, 7 are three-dimensionally symmetric with respect to each chip 3 of each layer. Although each of the packages 41, 51 has a thin profile, constituted of only three layers, and has an asymmetric structure with the center of the chip 3 of each layer being displaced, the internal structure satisfactorily suppresses deformations caused by warps and strains. Particularly, since the package 41, 51 has a thickness about three times as large as the thickness of the package 31 of the third embodiment, the structural strength is further enhanced, and the deformation due to warp and strain is satisfactorily inhibited.

Additionally, according to experiments conducted by the present inventors, when the number of layers is four or more, the deformation inhibiting effect due to structural strength of the whole package exceeds the deformation inhibiting effect of each of the packaging members 32, 32a, 32b, 33a, 33b, 34a, 34b, 7. Therefore, the number of laminations is limited to three or less in the packages 41, 51. Additionally, to implement the present invention, of course, the number of laminations in the semiconductor device is not limited to three or less. Even in the number of laminations with which the deformation inhibiting effect by the structure strength of the whole package exceeds the deformation inhibiting effect of the respective packaging members 32, 32a, 32b, 33a, 33b, 34a, 34b, 7, with the inner structure similar to that of the package 41, 51, further deformation inhibiting effect can be obtained.

As described above, according to the fourth embodiment, in spite of the thin structure of only three layers, the degree of freedom in arranging around the inner wiring in the package 41, 51 can be enhanced, and the semiconductor device 41, 51 can be made more compact. Additionally, since the strength of the whole package 41, 51 can further be enhanced, the stability and reliability can further be enhanced. Moreover, the semiconductor device 41, 51 has a long life.

Furthermore, the semiconductor device according to the present invention is not limited to the aforementioned first to fourth embodiments. Any part of the semiconductor devices according to the present invention may be combined or variously-altered within the range not departing from the scope of the present invention.

For example, a capability, type, function, shape of a semiconductor chip mounted on a chip-mounting substrate, a number of laminations of a substrate, a number, position, and posture of a chip mounted on the substrate, and a like can be appropriately set in accordance with a desired capability and function of a semiconductor device. Particularly, an offset and rotation states in mounting a chip on a substrate may be appropriately set to so that a degree of freedom in arranging various wirings in a semiconductor device can be enhanced, and a whole package can be made more compact. Similarly, a pattern of the chip connection wiring, an internal constitution of a whole semiconductor device, and a like can also be appropriately set in accordance with a desired capability and function of a semiconductor device.

Moreover, when a plurality of semiconductor chips are mounted on a chip-mounting substrate, a plurality of relay terminals may be disposed to surround each chip. In this case, for example, each chip may be disposed on a chip-mounting substrate in such a manner that the center of the chip is offset from the center of the whole arrangement of the plurality of relay terminals disposed for each chip.

Alternatively, a plurality of relay terminals may be disposed to collectively surround a plurality of semiconductor chips. In this case, for example, the center of the arrangement of all the chips may be set so as to correspond to the center of one semiconductor chip in each embodiment. Moreover, the respective chips may be disposed on the substrate in such a manner that the center of the arrangement of all the chips is offset from the center of the whole arrangement of the relay terminals. This also applies to a case in which a plurality of substrates are arranged in the same layer. The settings may appropriately be brought to the adequate states so that the degree of freedom in arranging various wirings in the semiconductor device can be enhanced, and the whole semiconductor device can be made more compact.

Additional advantages and modifications will readily occur to those skilled in the art. Therefore, the invention in its broader embodiments is not limited to the specific details and representative embodiments shown and described herein. Accordingly, various modifications may be made without departing from the spirit or scope of the general inventive concept as defined by the appended claims and their equivalents.

What is claimed is:

1. A laminated-chip semiconductor device comprising:
 a first chip-mounting substrate on which at least one semiconductor chip having a plurality of terminals is mounted, and a plurality of relay terminals electrically connected to said respective terminals of said semiconductor chip are disposed to surround a portion with said semiconductor chip mounted thereon from the outside in the vicinity of said portion; and
 a second chip-mounting substrate which is laminated on said first chip-mounting substrate and on which at least one said semiconductor chip is mounted, a plurality of relay terminals electrically connected to said respective terminals of said semiconductor chip are disposed to surround a portion with said semiconductor chip mounted thereon from the outside in the vicinity of said portion, and at least one of said semiconductor chips has a center offset from a center of a whole arrangement of said relay terminals.

2. A laminated-chip semiconductor device comprising:
 a plurality of semiconductor chips having a plurality of terminals; and
 a plurality of chip-mounting substrates on each of which at least one of said semiconductor chips is mounted, a plurality of relay terminals electrically connected to said respective terminals of said semiconductor chip are disposed to surround a portion with said semiconductor chip mounted thereon from the outside in the vicinity of said portion, and at least one of said semiconductor chips has a center offset from a center of a whole arrangement of said relay terminals in at least one of two or more laminated layers.

3. The laminated-chip semiconductor device according to claim 2, wherein said chip-mounting substrates disposed in at least two predetermined layers among said chip-mounting substrates have centers of the whole arrangements of said relay terminals disposed on the chip-mounting substrates, which agree with each other.

4. The laminated-chip semiconductor device according to claim 2, wherein said relay terminals are disposed such that said center of the whole arrangement of said relay terminals is arranged to correspond with the center of said chip-mounting substrate.

5. The laminated-chip semiconductor device according to claim 2, wherein a side edge of at least one of said offset semiconductor chips is rotated by a predetermined angle from a mutual parallel state with respect to an arrangement opposite to the side edge of said semiconductor chip in the whole arrangement of said relay terminals.

6. The laminated-chip semiconductor device according to claim 2, wherein at least one pair of packaging members formed of predetermined materials are disposed around at least said offset semiconductor chip among said semiconductor chips so that the packaging members are symmetric with each other with respect to said semiconductor chip in the layer with said semiconductor chip disposed therein.

7. A laminated-chip semiconductor device comprising:
   a plurality of semiconductor chips having a plurality of terminals; and
   a plurality of chip-mounting substrates on each of which at least one of said semiconductor chips is mounted, a plurality of relay terminals electrically connected to said respective terminals of said semiconductor chip are disposed to surround a portion with said semiconductor chip mounted thereon from the outside in the vicinity of said portion, and at least one of said semiconductor chips has a center offset from a center of another semiconductor chip in at least two predetermined layers among two or more laminated layers.

8. The laminated-chip semiconductor device according to claim 7, wherein said chip-mounting substrates disposed in at least two predetermined layers among said chip-mounting substrates have centers of the whole arrangements of said relay terminals disposed on said chip-mounting substrates, which are arranged to correspond with each other.

9. The laminated-chip semiconductor device according to claim 7, wherein said relay terminals are disposed such that said center of the whole arrangement of said relay terminals is arranged to correspond with the center of said chip-mounting substrate.

10. The laminated-chip semiconductor device according to claim 7, wherein a side edge of at least one of said offset semiconductor chips is rotated by a predetermined angle from a mutual parallel state with respect to an arrangement opposite to the side edge of said semiconductor chip in the whole arrangement of said relay terminals.

11. The laminated-chip semiconductor device according to claim 7, wherein at least one pair of packaging members formed of predetermined materials are disposed around at least said offset semiconductor chip among said semiconductor chips so that the packaging members are symmetric with each other with respect to said semiconductor chip in the layer with said semiconductor chip disposed therein.

12. A laminated-chip semiconductor device comprising:
   a first chip-mounting substrate on which at least one semiconductor chip having a plurality of terminals is mounted, and a plurality of relay terminals electrically connected to said respective terminals of said semiconductor chip are disposed to surround a portion with said semiconductor chip mounted thereon from the outside in the vicinity of said portion; and
   a second chip-mounting substrate which is laminated on said first chip-mounting substrate and on which at least one said semiconductor chip is mounted, a plurality of relay terminals electrically connected to said respective terminals of said semiconductor chip are disposed to surround a portion with said semiconductor chip mounted thereon from the outside in the vicinity of said portion, and at least one of said semiconductor chips has a side edge rotated by a predetermined angle from a mutual parallel state with respect to an arrangement opposite to the side edge of said semiconductor chip in a whole arrangement of said relay terminals.

13. A laminated-chip semiconductor device comprising:
   a plurality of semiconductor chips having a plurality of terminals; and
   a plurality of chip-mounting substrates on each of which at least one of said semiconductor chips is mounted, a plurality of relay terminals electrically connected to said respective terminals of said semiconductor chip are disposed to surround a portion with said semiconductor chip mounted thereon from the outside in the vicinity of said portion, and at least one of said semiconductor chips has a side edge rotated by a predetermined angle from a mutual parallel state with respect to an arrangement opposite the side edge of said semiconductor chip in a whole arrangement of said relay terminals in at least one of two or more laminated layers.

14. The laminated-chip semiconductor device according to claim 13, wherein said chip-mounting substrates disposed in at least two predetermined layers among said chip-mounting substrates have centers of the whole arrangements of said relay terminals disposed on said chip-mounting substrates, which are arranged to correspond with each other.

15. The laminated-chip semiconductor device according to claim 13, wherein said relay terminals are disposed such that the center of the whole arrangement of said relay terminals is arranged to correspond with said center of said chip-mounting substrate.

16. The laminated-chip semiconductor device according to claim 13, wherein the center of at least one of said rotated semiconductor chips is offset from said center of the whole arrangement of said relay terminals.

17. The laminated-chip semiconductor device according to claim 13, wherein at least one pair of packaging members formed of predetermined materials are disposed around at least said rotated semiconductor chip among said semiconductor chips so that the packaging members are symmetric with each other with respect to said semiconductor chip in the layer with said semiconductor chip disposed therein.

18. A laminated-chip semiconductor device comprising:
   a plurality of semiconductor chips having a plurality of terminals; and
   a plurality of chip-mounting substrates on each of which at least one of said semiconductor chips is mounted, a plurality of relay terminals electrically connected to said respective terminals of said semiconductor chip are disposed to surround a portion with said semiconductor chip mounted thereon from the outside in the vicinity of said portion, and at least one of said semiconductor chips has a side edge rotated by a predetermined angle from a mutual parallel state with respect to at least two predetermined layers among two or more laminated layers.

19. The laminated-chip semiconductor device according to claim 18, wherein said chip-mounting substrates disposed in at least two predetermined layers among said chip-mounting substrates have the whole arrangements of said relay terminals, which are in a mutual parallel state between said layers.

20. The laminated-chip semiconductor device according to claim 18, wherein said relay terminals are disposed such that a center of the whole arrangement of said relay terminals is arranged to correspond with the center of said chip-mounting substrate.

21. The laminated-chip semiconductor device according to claim 18, wherein said center of at least one of said rotated semiconductor chips is offset from the center of the whole arrangement of said relay terminals.

22. The laminated-chip semiconductor device according to claim 18, wherein at least one pair of packaging members formed of predetermined materials are disposed around at least said rotated semiconductor chip among said semiconductor chips so that the packaging members are symmetric with each other with respect to said semiconductor chip in said layer with said semiconductor chip disposed therein.

23. A semiconductor device comprising:

a semiconductor chip;

one or a plurality of chip-mounting substrates on which at least one semiconductor chip is mounted, and which is constituted by laminating one to three layers along a thickness direction; and at least one pair of packaging members which are formed of predetermined materials and which are disposed around said semiconductor chip mounted on at least one layer of said chip-mounting substrate among said semiconductor chips mounted on said layers of said chip-mounting substrates so as to be symmetric with each other with respect to said semiconductor chip in said layer with said semiconductor chip disposed therein.

24. The semiconductor device according to claim 23, wherein the pair of said packaging members are formed of the same type of material.

25. The semiconductor device according to claim 23, further comprising a plurality of pairs of said packaging members formed of materials which differ with each pair.

26. The semiconductor device according to claim 23, wherein a plurality of pairs of packaging members are disposed in different positions so that said packaging members are symmetric with each other with respect to said semiconductor chip, and a predetermined pair of said packaging members among the plurality of pairs of said packaging members are formed of the same type of material.

27. The semiconductor device according to claim 23, wherein said packaging member is formed of an organic material.

28. A semiconductor device comprising:

a semiconductor chip;

one or a plurality of chip-mounting substrates on each of which at least one semiconductor chip is mounted, and each of which is constituted by laminating one or a plurality of layers along a thickness direction; and at least three pairs of packaging members which are formed of predetermined materials and which are disposed around said semiconductor chip mounted on at least one layer of said chip-mounting substrate among said semiconductor chips mounted on said layers of said chip-mounting substrates so as to be symmetric with one another with respect to said semiconductor chip in said layer with said semiconductor chip disposed therein.

29. The semiconductor device according to claim 28, wherein the pair of said packaging members are formed of the same type of material.

30. The semiconductor device according to claim 28, wherein said packaging member is formed of an organic material.

* * * * *